(12) United States Patent
Chen et al.

(10) Patent No.: US 10,658,450 B2
(45) Date of Patent: May 19, 2020

(54) DISPLAY SUBSTRATE, MANUFACTURING METHOD THEREOF, AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Yipeng Chen, Beijing (CN); Libin Liu, Beijing (CN)

(73) Assignees: BOE TECHNOLOGY GROUP CO., LTD., Beijing (CN); ORDOS YUANSHENG OPTOELECTRONICS TECHNOLOGY CO., LTD., Inner Mongolia (CN)

( * ) Notice: Subject to any disclaimer, the term of this patent is extended or adjusted under 35 U.S.C. 154(b) by 0 days.

(21) Appl. No.: 16/111,411

(22) Filed: Aug. 24, 2018

(65) Prior Publication Data
US 2019/0067387 A1 Feb. 28, 2019

(30) Foreign Application Priority Data
Aug. 31, 2017 (CN) .......................... 2017 1 0771357

(51) Int. Cl.
*H01L 27/32* (2006.01)
*H01L 51/00* (2006.01)
*H01L 51/52* (2006.01)
*H01L 51/56* (2006.01)
*H05K 1/14* (2006.01)
(Continued)

(52) U.S. Cl.
CPC ...... *H01L 27/3276* (2013.01); *G02F 1/13452* (2013.01); *G02F 1/133305* (2013.01); *G02F 1/133308* (2013.01); *G09G 3/3225* (2013.01); *H01L 27/3244* (2013.01); *H01L 51/0097* (2013.01); *H01L 51/56* (2013.01); *H05K 1/147* (2013.01); *H05K 1/189* (2013.01); *H01L 27/3288* (2013.01); *H01L 51/5253* (2013.01);
(Continued)

(58) Field of Classification Search
CPC ............ H01L 27/3244; H01L 27/3276; H01L 51/0097; H01L 51/56; H01L 2251/5338; H01L 2227/323; G09G 3/3225; G02F 1/13452; G02F 1/133305; G02F 1/133308; H05K 1/189; H05K 1/147; H05K 1/028; H05K 2201/056
See application file for complete search history.

(56) References Cited

U.S. PATENT DOCUMENTS 6,535,262 B2 * 3/2003 Houdeau ............. G02F 1/13452
349/150
9,321,677 B2 * 4/2016 Chang ................... C03C 21/002
(Continued)

*Primary Examiner* — Zandra V Smith
*Assistant Examiner* — Jeremy J Joy
(74) *Attorney, Agent, or Firm* — Calfee, Halter & Griswold LLP

(57) ABSTRACT

Embodiments of the present disclosure provide a display substrate, a manufacturing method thereof, and a display device. The display substrate includes: a display area; an edge area; a bent portion between the display area and the edge area, the edge area being bent at a predetermined angle towards a side facing away from a display surface of the display area by means of the bent portion; and a row driving circuit in the edge area.

20 Claims, 3 Drawing Sheets

(51) Int. Cl.
*H05K 1/18* (2006.01)
*G02F 1/1333* (2006.01)
*G02F 1/1345* (2006.01)
*G06F 3/041* (2006.01)
*G09G 3/3225* (2016.01)

(52) U.S. Cl.
CPC ............. *H01L 2227/323* (2013.01); *H01L 2251/5338* (2013.01)

(56) References Cited

U.S. PATENT DOCUMENTS

| | | | |
|---|---|---|---|
| 9,760,125 B2 * | 9/2017 | Kim | G06F 1/1652 |
| 10,096,669 B2 * | 10/2018 | Yamazaki | G04G 9/0088 |
| 2002/0135727 A1 * | 9/2002 | Nakaminami | G02F 1/13452 |
| | | | 349/149 |
| 2011/0007042 A1 * | 1/2011 | Miyaguchi | G02F 1/167 |
| | | | 345/204 |
| 2012/0146886 A1 * | 6/2012 | Minami | H01L 27/3276 |
| | | | 345/80 |
| 2013/0169515 A1 * | 7/2013 | Prushinskiy | G06F 1/1652 |
| | | | 345/55 |
| 2014/0240985 A1 * | 8/2014 | Kim | H05K 1/028 |
| | | | 362/249.04 |
| 2014/0355227 A1 * | 12/2014 | Lim | H04M 1/0268 |
| | | | 361/749 |
| 2015/0137098 A1 * | 5/2015 | Tanaka | H01L 27/3276 |
| | | | 257/40 |
| 2016/0204183 A1 * | 7/2016 | Tao | H01L 51/0097 |
| 2016/0308151 A1 * | 10/2016 | Kim | H01L 51/0097 |
| 2017/0117346 A1 * | 4/2017 | Kim | H01L 23/49555 |
| 2018/0034002 A1 * | 2/2018 | Kim | H01L 51/0097 |
| 2018/0081399 A1 * | 3/2018 | Kwon | G06F 1/1652 |

* cited by examiner

DISPLAY SUBSTRATE, MANUFACTURING METHOD THEREOF, AND DISPLAY DEVICE

RELATED APPLICATION

The present application claims the benefit of Chinese Patent Application No. 201710771357.3, filed on Aug. 31, 2017, the entire disclosure of which is incorporated herein by reference.

FIELD

The present disclosure relates to the field of organic optoelectronics, and particularly to a display substrate, a manufacturing method thereof, and a display device.

BACKGROUND

With the rapid development of display technologies, increasingly high requirements have been put on display screens. At present, narrow bezel display screens are highly favored by users. Since main operations of a touch panel display device are all done in the screen, a larger screen ratio is required to highlight an operable area. An advantage of a narrow bezel display device is to increase the screen ratio, so that extra area of the display device (such as a mobile phone) is reduced, giving users a better look and feel. In addition, the narrow bezel can further reduce the size of the device, because lateral width of a narrow bezel display device (such as mobile phone) is narrower than that of an ordinary bezel display device (such as mobile phone) in the case of the same screen area, making it easily hand-held. As a result, not only the sense of grip is improved, but also the operation space of the thumb is increased, which makes the use process more convenient.

However, the existing display substrate, manufacturing method thereof, and display device still need to be improved.

SUMMARY

An embodiment of the present disclosure provides a display substrate comprising: a display area; an edge area; a bent portion between the display area and the edge area, the edge area being bent at a predetermined angle towards a side facing away from a display surface of the display area by means of the bent portion; and a row driving circuit in the edge area.

According to some embodiments of the present disclosure, the predetermined angle ranges from 0° to about 180°.

According to some embodiments of the present disclosure, the predetermined angle is about 90°.

According to some embodiments of the present disclosure, the display substrate further comprises a pixel circuit disposed in the display area, wherein the bent portion comprises a conductive layer, and the pixel circuit is electrically connected to the row driving circuit via the conductive layer.

According to some embodiments of the present disclosure, the bent portion further comprises a groove.

According to some embodiments of the present disclosure, a depth of the groove is about ⅓-⅔ of a thickness of the bent portion.

According to some embodiments of the present disclosure, the groove comprises a filling layer and the conductive layer is disposed on the filling layer.

According to some embodiments of the present disclosure, the bent portion further comprises a protective layer covering the conductive layer.

According to some embodiments of the present disclosure, the bent portion has a length of about 1.8 to 2.1 mm.

According to some embodiments of the present disclosure, the display substrate comprises two bent portions, the display area is a quadrangle, and the two bent portions are respectively disposed at edges of the display area symmetrically.

According to some embodiments of the present disclosure, the display substrate further comprises a connection lead disposed between the pixel circuit and the conductive layer.

According to some embodiments of the present disclosure, the display substrate further comprises a connection lead disposed between the row driving circuit and the conductive layer.

According to some embodiments of the present disclosure, the display area comprises an organic light emitting device.

According to some embodiments of the present disclosure, a substrate material of the display substrate comprises at least one of glass, PET, and polyimide.

Another embodiment of the present disclosure provides a display device comprising any of the display substrates described above.

A further embodiment of the present disclosure provides a method for manufacturing a display substrate comprising: providing a substrate, the substrate comprising a display area, an edge area, and a spacing region located between the display area and the edge area; forming a bent portion in the spacing region; and forming a row driving circuit in the edge area. The edge area is bent at a predetermined angle towards a side facing away from a display surface of the display area by means of the bent portion.

According to some embodiments of the present disclosure, the predetermined angle ranges from 0° to about 180°.

According to some embodiments of the present disclosure, forming the bent portion in the spacing region comprises: forming a groove in the spacing region by a patterning process; forming a filling layer in the groove; and subjecting the spacing region to a bending process to obtain the bent portion.

According to some embodiments of the present disclosure, a depth of the groove is about ⅓ to ⅔ of a thickness of the substrate.

According to some embodiments of the present disclosure, before the bending process, the above method further comprises: forming a conductive layer on a side of the filling layer away from the substrate such that the conductive layer electrically connects a pixel circuit located in the display area to the row driving circuit; and forming a protective layer on a side of the conductive layer away from the filling layer.

BRIEF DESCRIPTION OF THE DRAWINGS

The above and/or additional embodiments and advantages of the present disclosure will become apparent and easily understood from the description of embodiments with reference to the drawings below.

DETAILED DESCRIPTION

Figure 1:
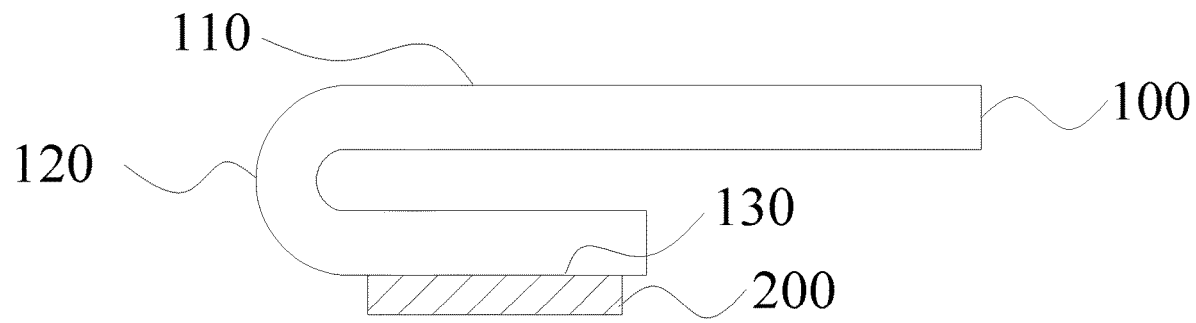
FIG. 1 illustrates a schematic structural view of a display substrate according to an embodiment of the present disclosure.

Embodiments of the present disclosure will be described in detail below, and examples of the embodiments are illustrated in the drawings, wherein the same or similar reference numerals denote the same or similar elements or elements having the same or similar functions. The embodiments described below with reference to the accompanying drawings are intended to be illustrative, which are only used for explaining the present disclosure but cannot be understood as a limitation to the present disclosure.

Inventors of the present application have recognized that most of the existing touch screen display devices involve problems of poor display effect and limited operation space. This is mainly caused by a wide bezel of the touch screen display device. Specifically, for display screens of the same size, if the bezel is wider, the area of the display area is smaller, so that an operation space of a finger is reduced, and the display effect is thus affected. On the other hand, if the display area is the same in area and the bezel is wider, the width of the display screen will become larger, which impairs hand-held operation and affects the use. Currently, a narrow bezel design used to solve the above problems is achieved by compressing the bezel. The inventors have found that a row driving circuit accounts for a large proportion in the entire bezel width, wherein the width of output TFTs in the row driving circuit is the largest, and the aspect ratio of the output TFTs determines driving capability of the row driving circuit. Therefore, compressing the size of the row driving circuit would cause the size of the output TFTs in the row driving circuit to be smaller, thereby affecting the driving capability of the row driving circuit and further impacting on the performance of the touch screen display device.

In view of this, in an embodiment of the present disclosure, there is provided a display substrate. According to an embodiment of the present disclosure, referring to FIG. 1, the display substrate comprises a substrate 100 and a row driving circuit 200. The substrate 100 comprises a display area 110, an edge area 130, and a bent portion 120. The bent portion 120 is disposed between the display area 110 and the edge area 130, and the edge area 130 is bent at a predetermined angle towards a side facing away from a display surface of the display area 110 by means of the bent portion 120. A row driving circuit 200 is disposed in the edge area 130. As used herein, the "display surface" refers to a surface of the display substrate where images are displayed. Specifically, in the orientation as shown in FIG. 1, the display surface of the display substrate is the upper surface of the display substrate.

In an exemplary embodiment of the present disclosure, the above predetermined angle may be selected to be any angle in the range of (0°-180°]. For example, the edge area 130 may be disposed perpendicular to the display area 110 by means of the bent portion 120, i.e. the predetermined angle is 90°. Alternatively, the edge area 130 may be disposed in parallel with the display area 110 via the bent portion 120, i.e. the predetermined angle is 180°, as shown in FIGS. 1 and 2. In the case where the edge area 130 may be disposed in parallel with the display area 110 by means of the bent portion 120, it is possible to not only realize the narrow bezel design, but also enable a display device composed of the display substrate to have a small thickness.

Figure 2:
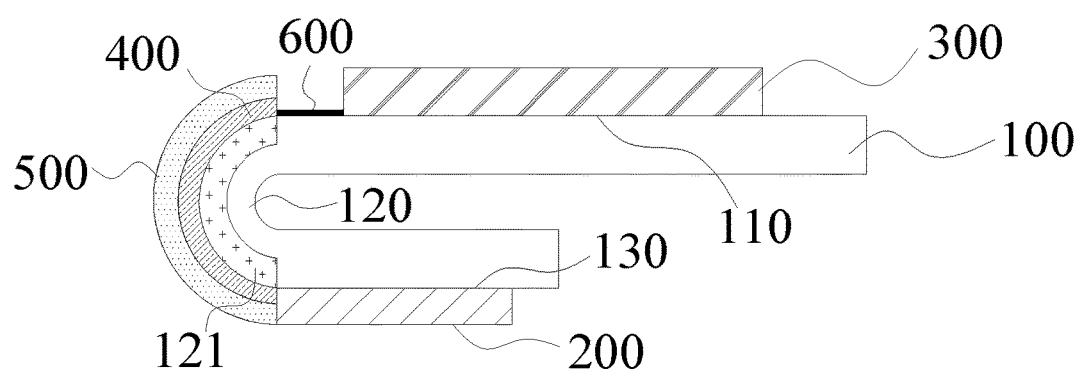
FIG. 2 illustrates a schematic structural view of a display substrate according to another embodiment of the present disclosure.

In the display substrate as shown in FIG. 1, the edge area 130 is bent at, for example, 180° by means of the bent portion 120 towards a side facing away from the display surface of the display area 110, and the row driving circuit 200 is disposed in the edge area 130, thus the bezel of the display substrate on the side of the display area 110 is minimized without affecting the driving capability of the row driving circuit 200. Consequently, a display device composed of the display substrate may have a narrow bezel, thereby having a better display effect and a large operation space.

To facilitate understanding, the operating principle of the display substrate according to an embodiment of the present disclosure will be briefly described below.

As mentioned above, a typical narrow bezel design is achieved by compressing the bezel. However, the inventors have found that since the row driving circuit accounts for a large proportion in the entire bezel width, the compression of the bezel will constrain the design of the row driving circuit and further affect the driving capability of the row driving circuit, which in turn affects the performance of the final display device. According to an embodiment of the present disclosure, a bending technique is applied such that the row driving circuit is bent towards a back surface of the display substrate (i.e. a surface opposite to the display surface of the display substrate), thus the bezel of the display can be reduced without affecting the driving capability of the row driving circuit. In addition, since the row driving circuit is bent towards the back surface of the display substrate, its size is no longer constrained by the narrow bezel, so that the output TFTs in the row driving circuit can have a proper size, ensuring that the row driving circuit has a high driving capability. Specifically, the display substrate has a bent portion, and the row driving circuit is electrically connected to a pixel circuit at the bent portion by a special wiring design and a conductive layer having a small sheet resistance, thereby realizing display control of the display area.

Hereinafter, each structure of the display substrate will be described in detail according to specific embodiments of the present disclosure.

Material of the substrate 100 is not particularly limited, and those skilled in the art can make a design based on specific situations. For example, according to an embodiment of the present disclosure, the substrate 100 may be formed of at least one of glass, PET, and polyimide. Therefore, the substrate may be made of the extensively available materials as described above, thereby saving the production cost. That is, the substrate may be a rigid substrate or a substrate having certain flexibility.

FIG. 2 illustrates a display substrate according to another embodiment of the present disclosure. Referring to FIG. 2, the display substrate comprises a substrate 100, a row driving circuit 200, and a pixel circuit 300. The substrate 100 comprises a display area 110, a bent portion 120, and an edge portion 130. The bent portion 120 is disposed between the display area 110 and the edge area 130. The pixel circuit 300 is disposed in the display area 110, and the row driving circuit 200 is disposed in the edge area 130. The bent portion 120 includes a conductive layer 400, and the pixel circuit 300 may be connected to the row driving circuit 200 via the conductive layer 400. Material of the conductive layer is not particularly limited as long as the electrical resistance of the conductive material is small, and those skilled in the art can make a design based on specific situations. For example, the conductive layer 400 may be formed of Cu or an alloy having a small resistivity. Specifically, the conductive layer 400 may be formed using Ti/Al/Ti. Further, the conductive layer 400 may also be formed using a flexible conductive material such as indium tin oxide (ITO). In this way, the pixel circuit and the row driving circuit located on two sides of the bent portion can be electrically connected by the conductive layer.

As shown in FIG. 2, the display substrate further comprises a connection lead 600 disposed between the pixel circuit 300 and the conductive layer 400 so as to electrically connect the pixel circuit 300 to the conductive layer 400. Similarly, in an exemplary embodiment, the display substrate may further comprise a connection lead (shown in FIG. 5) disposed between the row driving circuit 200 and the conductive layer 400 so as to electrically connect the row driving circuit 200 to the conductive layer 400. Alternatively, in other exemplary embodiments, the connection leads 600 may be omitted, wherein the pixel circuit 300 is in direct electrical contact with the conductive layer 400 and the row driving circuit 200 is in direct electrical contact with the conductive layer 400.

According to an embodiment of the present disclosure, the bent portion 120 is formed by bending a portion of the substrate 100 located between the display area 110 and the edge area 130. When the substrate 100 is made of a rigid material such as glass, it may break if it is subjected to a bending process directly. Therefore, in such a case, it is necessary to improve the structure of the substrate 100 before it is subjected to a bending process.

Figure 5:
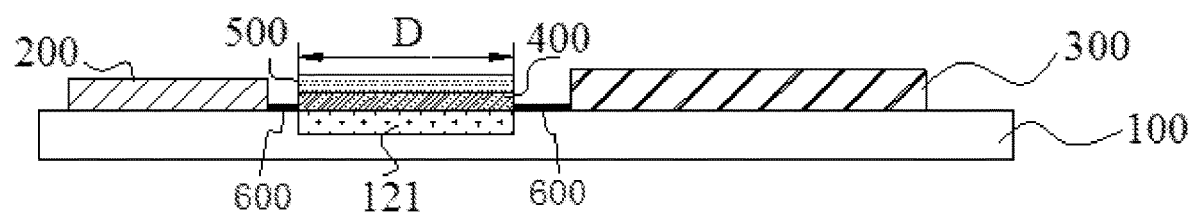
FIG. 5 illustrates a schematic structural view of a display substrate according to an embodiment of the present disclosure.

According to an embodiment of the present disclosure, the substrate 100 includes a bent portion 120. The bent portion 120 may be bent after the pixel circuit of the display area and the row driving circuit of the edge area are prepared and before a subsequent assembly process, as shown in FIG. 2. Alternatively, as shown in FIG. 5, before the subsequent assembly process, a portion of the display substrate to which the bent portion 120 corresponds may not be bent, but the display substrate may be bent during subsequent assembly to form a curved bent portion.

According to an embodiment of the present disclosure, the bent portion 120 has a groove. As will be understood by those skilled in the art, the pixel circuit is disposed in the display area, and the row driving circuit is disposed in the edge area. Therefore, in the process of preparing the above circuit, it is required to deposit a plurality of inorganic layers (e.g. dielectric layer, interlayer insulating layer, planarization layer, etc.) on the substrate 100. The groove of the bent portion 120 may be formed by etching the above inorganic layers. Alternatively, the groove may also extend into the substrate 100, that is, the groove is formed by etching the inorganic layers deposited on the substrate and a portion of the substrate.

Typically, a neutral layer of the substrate is generally at an intermediate position of the substrate. During the bending process, the substrate at that position is subjected to neither tension nor pressure, so that the substrate at that position does not break or crack during the bending process. As used herein, the term "neutral layer" refers to a transition layer on a section of a structure which is subjected to neither tension nor pressure during the bending process in which an outer layer is stretched and an inner layer is pressed. The stress on this transition layer is almost equal to zero, and this transition layer is the neutral layer of the structure. The length of the neutral layer stays unchanged during the bending process. Accordingly, the groove of the bent portion may be disposed at the position of the neutral layer of the substrate. Therefore, according to an embodiment of the present disclosure, a groove is disposed in a predetermined region of the substrate, and the depth of the groove may be ⅓ to ⅔ of the thickness of the substrate. In this way, it is possible to prevent the substrate from breaking and cracking during the bending process. It is to be noted that the "predetermined region of the substrate" refers to a spacing region between the display area and the edge area where the bent portion is to be formed.

In an exemplary embodiment, a filling layer 121 may be disposed in the groove (that is, the filling layer 121 fills the groove), and the conductive layer 400 is disposed on a side of the filling layer 121 away from the groove. By providing the filling layer 121 in the groove of the bent portion 120, the mechanical performance of the substrate can be improved so that the substrate can be prevented from breaking and cracking during the bending process. Material of the filling layer is not particularly limited as long as the above requirements are satisfied, and those skilled in the art can make a design based on specific situations. For example, according to an embodiment of the present disclosure, the filling layer 121 may be formed of an organic material having certain flexibility. For example, specifically, the filling layer 121 may be composed of polyimide, PET, a resin material, silicone or the like. In an exemplary embodiment, the filling layer 121 may be an entire layer structure formed of polyimide, or may include two or more layers of polyimide sublayers and a reinforcing material layer disposed between the polyimide sublayers so as to enhance the mechanical performance of the filling layer 121 during the subsequent bending process. According to a specific embodiment of the present disclosure, the reinforcing material may be silicon oxide ($SiO_x$). Thus, by providing the filling layer 121 in the groove of the bent portion 120, it is possible to prevent the substrate from breaking and cracking during the bending process.

It is to be noted that the position where the edge area is disposed is not particularly limited, and those skilled in the art can make a design based on specific situations. For example, according to an embodiment of the present disclosure, the edge area 130 may be disposed perpendicular to the display area 110 by means of the bent portion 120 (not shown), and may also be disposed in parallel with the display area 110 by means of the bent portion 120, as shown in FIGS. 1 and 2. As a result, a narrow bezel design can be realized, and the display effect and the operation space of a display device composed of the display substrate can be further improved. By designing the length of the bent portion 120, the overall thickness of the display substrate finally obtained can be controlled. If the bent portion 120 is too long, the vertical distance between the display area 110 and the edge area 130 provided with the row driving circuit is too large after bending, so that the overall thickness of the display substrate is excessively increased. On the contrary, if the bent portion 120 is too short, the bent portion 120 has a small radius of curvature after bending, so that the stress received by the bent portion 120 is large. According to an embodiment of the present disclosure, the length (D as shown in FIG. 5) of the bent portion 120 may range from 1.8 to 2.1 mm. In particular, according to a specific embodiment of the present disclosure, the length of the bent portion 120 may be 2 mm. Therefore, on the one hand, portions of the substrate on two sides of the bent portion 120 can be better adhered to prevent the finally formed substrate from being too thick, and on the other hand, the bending stress received by the bent portion 120 can be moderated, thereby preventing the substrate from breaking and cracking during the bending process. As used herein, "the length of the bent portion 120" refers to the length of the bent portion 120 along the horizontal direction of the display substrate when it is not bent, as shown by D in FIG. 5.

According to an embodiment of the present disclosure, in order to further prevent the substrate from breaking and cracking during the bending process, the display substrate may further comprise a protective layer 500. The protective layer 500 is disposed on the bent portion 120 and covers at least a surface of a side of the conductive layer 400 away from the substrate 100. Material of the protective layer is not particularly limited as long as it has certain elasticity, and those skilled in the art can make a design based on specific situations. For example, according to an embodiment of the present disclosure, the protective layer 500 may be silicone. When the substrate 100 is being bent, the protective layer 500 can adjust the degree of bending of the substrate 100 so as to protect the substrate from breaking and cracking.

Figure 3:
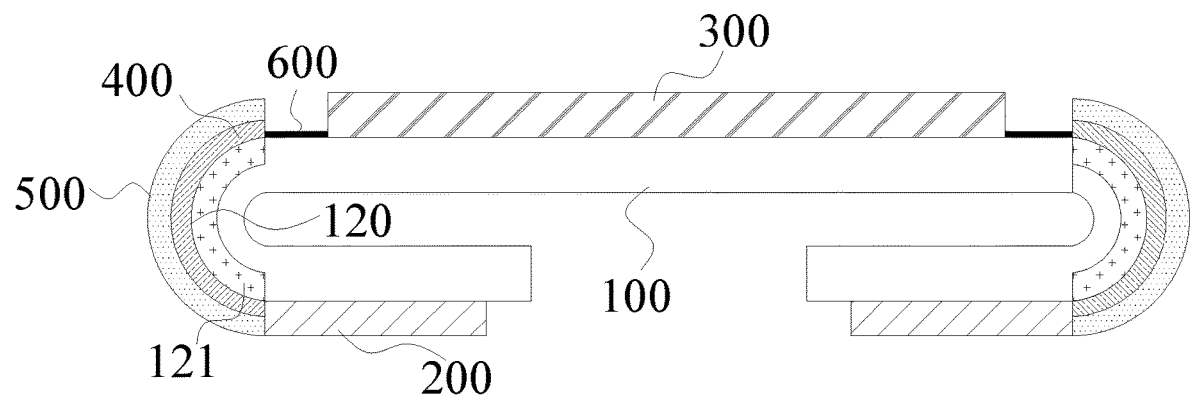
FIG. 3 illustrates a schematic structural view of a display substrate according to a further embodiment of the present disclosure.

According to an embodiment of the present disclosure, referring to FIG. 3, the substrate 100 may include two bent portions 120 and two edge areas 130. The display area 110 may be a quadrangle, the two bent portions 120 are symmetrically disposed on two sides of the display area 110, and the two edge areas 130 are connected to the display area 110 through corresponding bent portions 120.

The type of the display is not particularly limited, and those skilled in the art can make a design based on specific situations. For example, according to an embodiment of the present disclosure, the display may be an organic light emitting diode display, that is, an organic light emitting device is disposed in the display area. In this way, the organic light emitting diode display may have a small bezel, thereby improving the display effect and the operation space of the organic light emitting diode display.

In another embodiment of the present disclosure, there is provided a display device comprising the display substrate described above. Therefore, the display device has all the features and advantages of the display substrate described above, and details are not described here again. In general, the display device has a narrow bezel, and hence has a better display effect and a larger operation space.

Figure 4:
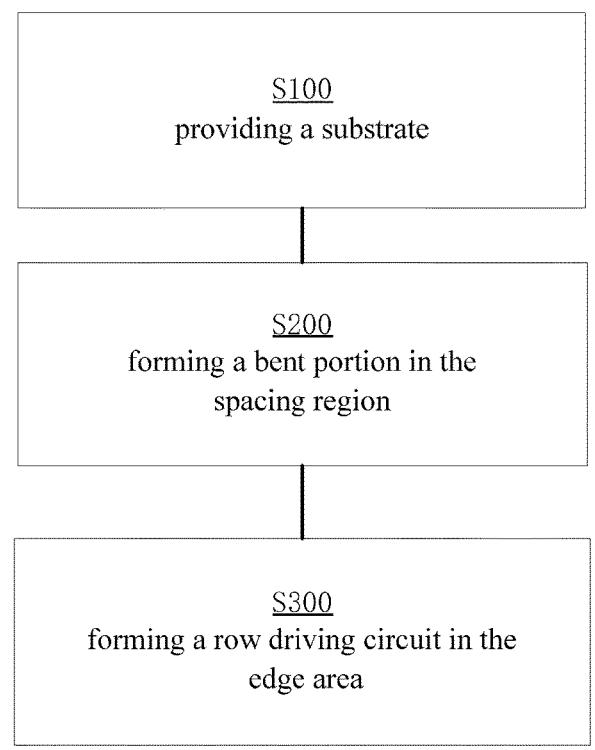
FIG. 4 illustrates a flowchart of a method for manufacturing a display substrate according to an embodiment of the present disclosure.

In a further embodiment of the present disclosure, there is provided a method for manufacturing any of the display substrates described above. The display substrate manufactured by this method may have the same features and advantages as the display substrate described above, and details are not described here again. According to an embodiment of the present disclosure, referring to FIG. 4, the method comprises, at step S100, providing a substrate comprising a display area, an edge area, and a spacing region located between the display area and the edge area. The method further comprises forming a bent portion in the spacing region at step S200, and forming a row driving circuit in the edge area at step S300. Specifically, the edge area is bent at a predetermined angle towards a side facing away from a display surface of the display area by means of the bent portion. The predetermined angle may be any angle between 0° and 180°, such as 90° or 180°.

The material of the substrate has been described in detail previously and will not be described here again. For example, the substrate may be composed of glass or polyimide (PI) or PET.

In the above manufacturing method, the row driving circuit is bent towards a back surface of the display substrate (i.e. a surface opposite to the display surface of the display substrate) by using the bending technique, so that the bezel of the display can be reduced without affecting the driving capability of the row driving circuit. In addition, since the row driving circuit is bent towards the back surface of the display substrate, its size is no longer constrained by the narrow bezel, so that the output TFTs in the row driving circuit can have a proper size, ensuring that the row driving circuit has a high driving capability.

According to an embodiment of the present disclosure, referring to FIG. 5, the step of forming a bent portion in the spacing region may include first disposing a pixel circuit 300 in the display area 110 of the substrate, and disposing a row driving circuit 200 in the edge area 130. The pixel circuit 300 is spaced apart from the row driving circuit 200 by a spacing region. The spacing region extends along an edge of the display area 110 towards a side away from the display area 110. A connection lead 600 is disposed in the display area 110 to electrically connect the pixel circuit 300. The position where the spacing region is disposed is not particularly limited, and those skilled in the art can make a design based on the specific size of the display device. For example, according to an embodiment of the present disclosure, the spacing region may be connected to the row driving circuit 200, thus the connection lead 600 may not be disposed between the spacing region and the row driving circuit, as shown in FIG. 2. According to other embodiments of the present disclosure, the spacing region may also be disposed at a position between the pixel circuit 300 and the row driving circuit 200, and then connect the pixel circuit 300 and the row driving circuit 200 by means of the connection lead 600, as shown in FIG. 5.

Thereafter, a groove is formed in the spacing region by a patterning process. The specific manner of the patterning process is not particularly limited. For example, according to an embodiment of the present disclosure, the groove may be formed by photolithography. The neutral layer of the substrate is generally at an intermediate position of the substrate. During the bending process, the substrate at that position is subjected to neither tension nor pressure, so that the substrate does not break or crack during the bending process. As used herein, the term "neutral layer" refers to a transition layer on a section of a structure which is subjected to neither tension nor pressure during the bending process in which an outer layer is stretched and an inner layer is pressed. The stress on this transition layer is almost equal to zero, and this transition layer is the neutral layer of the structure. The length of the neutral layer stays unchanged during the bending process. Accordingly, the groove of the bent portion may be disposed at the position of the neutral layer of the substrate. Therefore, according to an embodiment of the present disclosure, a groove is disposed in the spacing region of the substrate, and the depth of the groove may be ⅓ to ⅔ of the thickness of the substrate. In this way, it is possible to prevent the substrate from breaking and cracking during the bending process.

Subsequently, a filling layer is formed in the groove. The material of the filling layer has been described in detail previously and will not be described here again. For example, the groove may be filled with an organic material such as polyimide, PET or the like. The filling layer may have all the features and advantages of the filling layer described above, which will not be described here again.

Finally, the bent portion is obtained by subjecting the above spacing region to a bending process. Consequently, the bent portion can be obtained by a simple production process.

According to an embodiment of the present disclosure, in order to further improve the performance of the display substrate manufactured by this method, before the bending process, the method may further comprise: disposing a conductive layer on a side of the filling layer away from the substrate so as to connect the pixel circuit and the row driving circuit. As described above, when the groove is being formed, the substrate in the spacing region is subjected to photolithography, thus the pixel circuit and the row driving circuit are disconnected. Therefore, it is required to design the connection lead at the bent portion to ensure an electrical connection between the pixel circuit and the row driving circuit. Therefore, according to an embodiment of the present disclosure, a conductive layer is disposed on the filling layer, and the conductive layer is in contact with the connection lead such that an electrical connection between the pixel circuit and the row driving circuit is enabled. The material of the conductive layer is not particularly limited as long as it is a metal material having a small electrical resistance, and those skilled in the art can make a design based on specific situations. For example, according to an embodiment of the present disclosure, the conductive layer may include Cu or Ti/Al/Ti, or an organic conductive material such as indium tin oxide (ITO). In this way, the electrical connection at the bent portion can be achieved. Since the conductive layer is disposed on a side of the filling layer away from the substrate, in the subsequent bending process, the flexibility of the filling layer can be utilized to prevent the conductive layer from breaking during the bending process, which will cause the circuit to be broken.

In addition, according to an embodiment of the present disclosure, the method may further comprise disposing a protective layer at the bent portion. According to an embodiment of the present disclosure, the protective layer covers a surface of a side of the conductive layer away from the filling layer. The material of the protective layer has been described in detail previously and will not be described here again. For example, according to an embodiment of the present disclosure, the protective layer may be formed of silicone. According to an embodiment of the present disclosure, the protective layer may adjust the neutral layer of the substrate so as to adjust the degree of bending of the substrate, thereby protecting the substrate against break and crack. According to an embodiment of the present disclosure, the above protective layer may also be disposed prior to the bending process. Thus, the conductive layer can be further protected.

According to an embodiment of the present disclosure, the step of the bending process may not be performed until the display substrate needs to be assembled with other structures. Therefore, the display substrate is of a flat structure during preparation and transportation, and when it is required to be assembled with other structures, the substrate provided with the conductive layer and the protective layer is subjected to the bending process. This makes it easy to transport.

In summary, by etching the spacing region of the substrate and filling the flexible material, it can be ensured that the substrate will not break or crack during the subsequent bending process. Disposing a conductive layer on a side of the filling layer away from the substrate enables an electrical connection between the pixel circuit and the row driving circuit at the bent portion, thereby obtaining a display substrate capable of reducing the bezel of the display device and enabling display control of the display device. The substrate before the bending process may be as shown in FIG. 5, and when the assembly is being performed, the substrate is bent at the bent portion to realize a narrow bezel design according to embodiments of the present disclosure. According to embodiments of the present disclosure, the way for bending the bent portion is not particularly limited, and those skilled in the art can make selection according to parameters such as the specific material of the substrate.

In the description of the present disclosure, the orientations or positional relationships denoted by the terms "upper", "lower" and the like are based on the orientations or positional relationships shown in the drawings, and are merely for the convenience of describing the present disclosure, which do not require the present disclosure to be necessarily constructed and operated in a specific orientation, and thus cannot be construed as limiting the present disclosure.

In the description of the present specification, the description with reference to the term "an embodiment", "another embodiment" or the like means that the specific features, structures, materials or characteristics described in connection with the embodiment are included in at least one embodiment of the present disclosure. In the specification, the schematic statements of the above terms are not necessarily directed to the same embodiments or examples. Furthermore, the specific features, structures, materials, or characteristics described may be combined in a suitable manner in any one or more embodiments or examples. In addition, various embodiments or examples described in the specification, as well as features of various embodiments or examples, may be combined by those skilled in the art in the case of causing no conflict. In addition, it is to be noted that in the specification, the terms "first" and "second" are used for descriptive purposes only and are not to be construed as indicating or implying a relative importance or implicitly indicating the number of technical features indicated.

While embodiments of the present disclosure have been shown and described above, it can be understood that the above-described embodiments are illustrative and are not to be construed as limiting the present disclosure. Variations, modifications, substitutions and changes may be made to the above-described embodiments by those ordinarily skilled in the art within the scope of the present disclosure.

The invention claimed is:

1. A display substrate comprising:
    a display area;
    an edge area;
    a bent portion between the display area and the edge area, the edge area being bent at a predetermined angle towards a side facing away from a display surface of the display area by means of the bent portion; and
    a row driving circuit in the edge area, wherein
the bent portion comprises a conductive layer and a groove, wherein the groove is recessed into the bent portion along a direction facing away from the display surface of the display area, the groove comprises a filling layer and the conductive layer is disposed on the filling layer.

2. The display substrate according to claim 1, wherein the predetermined angle ranges from 0° to about 180°.

3. The display substrate according to claim 2, wherein the predetermined angle is about 90°.

4. The display substrate according to claim 1, further comprising a pixel circuit disposed in the display area, wherein the pixel circuit is electrically connected to the row driving circuit via the conductive layer.

5. The display substrate according to claim 4, wherein the bent portion further comprises a protective layer covering the conductive layer.

6. The display substrate according to claim 4, further comprising a connection lead disposed between the pixel circuit and the conductive layer.

7. The display substrate according to claim 4, further comprising a connection lead disposed between the row driving circuit and the conductive layer.

8. The display substrate according to claim 1, wherein a depth of the groove is about ⅓-⅔ of a thickness of the bent portion.

9. The display substrate according to claim 1, wherein the bent portion has a length of about 1.8 to 2.1 mm.

10. The display substrate according to claim 1, wherein the display substrate comprises two bent portions, the display area is a quadrangle, and the two bent portions are respectively disposed at edges of the display area symmetrically.

11. The display substrate according to claim 1, wherein the display area comprises an organic light emitting device.

12. The display substrate according to claim 1, wherein a substrate material of the display substrate includes at least one of glass, PET, and polyimide.

13. A display device comprising the display substrate according to claim 1.

14. The display substrate according to claim 1, wherein an orthographic projection of an edge of the row driving circuit closer to the display area on the display surface coincides with an orthographic projection of an edge of the groove away from the display area on the display surface.

15. A method for manufacturing a display substrate comprising: providing a substrate, the substrate comprising a display area, an edge area, and a spacing region located between the display area and the edge area;
   forming a bent portion in the spacing region; and
   forming a row driving circuit in the edge area,
   wherein the edge area is bent at a predetermined angle towards a side facing away from a display surface of the display area by means of the bent portion, and
   wherein forming the bent portion in the spacing region comprises:
   forming a groove in the spacing region by a patterning process, such that the groove is recessed into the bent portion along a direction facing away from the display surface of the display area,
   forming a filling layer in the groove, and
   forming a conductive layer on a side of the filling layer away from the substrate such that the conductive layer electrically connects a pixel circuit located in the display area to the row driving circuit.

16. The method according to claim 15, wherein the predetermined angle ranges from 0° to about 180°.

17. The method according to claim 15, wherein forming the bent portion in the spacing region further comprises:
   subjecting the spacing region to a bending process to obtain the bent portion.

18. The method according to claim 17, wherein a depth of the groove is about ⅓ to ⅔ of a thickness of the substrate.

19. The method according to claim 17, before the bending process, further comprising:
   forming a protective layer on a side of the conductive layer away from the filling layer.

20. The method according to claim 15, wherein an orthographic projection of an edge of the row driving circuit closer to the display area on the display surface coincides with an orthographic projection of an edge of the groove away from the display area on the display surface.

* * * * *